US 6,586,156 B2

(12) United States Patent
Angelopoulos et al.

(10) Patent No.: US 6,586,156 B2
(45) Date of Patent: Jul. 1, 2003

(54) ETCH IMPROVED RESIST SYSTEMS CONTAINING ACRYLATE (OR METHACRYLATE) SILANE MONOMERS

(75) Inventors: Marie Angelopoulos, Cortlandt Manor, NY (US); Wu-Song Huang, Poughkeepsie, NY (US); Dai Junyan, Ithaca, NY (US); Ranee W. Kwong, Wappingers Falls, NY (US); Robert N. Lang, Pleasant Valley, NY (US); Arpan P. Mahorowala, Bronxville, NY (US); David R. Medeiros, Ossining, NY (US); Wayne M. Moreau, Wappingers Falls, NY (US); Karen E. Petrillo, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/907,392

(22) Filed: Jul. 17, 2001

(65) Prior Publication Data

US 2003/0049561 A1 Mar. 13, 2003

(51) Int. Cl.$^7$ .......................... G03F 7/004; C08F 30/08
(52) U.S. Cl. .................. 430/270.1; 430/313; 430/326; 430/905; 526/266; 526/279; 526/319
(58) Field of Search .............................. 430/270.1, 905, 430/313, 326; 526/279, 266, 319

(56) References Cited

U.S. PATENT DOCUMENTS 4,788,127 A * 11/1988 Bailey et al. ............... 430/192

FOREIGN PATENT DOCUMENTS

| JP | 1-126640 | * | 5/1989 |
| JP | 2001-114835 | * | 4/2001 |

OTHER PUBLICATIONS

CA abstract AN 1990:66761 of JP 1–126640, May 1989.*
CA abstract AN 2001:288865 of JP 2001–114835, Apr. 2001.*

* cited by examiner

Primary Examiner—Rosemary Ashton
(74) Attorney, Agent, or Firm—Steven Capella

(57) ABSTRACT

A chemically amplified (CA) photoresist system wherein a terpolymer containing ketal/phenolic/silicon based sidechains is provided. Among other things, the terpolymers provide for improved bake technologies. In another aspect a process for lithographic treatment of a substrate by means of ketal/phenolic/silicon based compositions and corresponding processes for the production of an object, particularly an electronic component are provided.

23 Claims, No Drawings

ETCH IMPROVED RESIST SYSTEMS CONTAINING ACRYLATE (OR METHACRYLATE) SILANE MONOMERS

BACKGROUND OF THE INVENTION

1. Field of the Invention

The present invention relates to photolithography, and more specifically to a chemically amplified (CA) photoresist system wherein a terpolymer containing ketal, phenol and silicon based side chains is utilized. Among other things, the terpolymers of the present invention provide for improved bake technologies. In another aspect, the present invention relates to a process for lithographic treatment of a substrate by means of ketal/phenolic/silicon-based compositions and corresponding processes for the production of an object, particularly an electronic component.

2. Description of the Prior Art

In recent years, resolution capacity that can be obtained with conventional deep-UV microlithography has reached its limits. Normally, it is no longer possible to produce conventional structures on a substrate with dimensions of less than 0.25 $\mu$m, as is required for the production of particularly highly integrated electronic components that have been targeted recently. Such conventional structures have minimal dimensions down to approximately 0.10 $\mu$m. In order to be able to resolve sufficiently, in an optical manner, such fine structural elements, short wave radiation must be utilized which generally has a wavelength between 126 and 260 nm.

Chemically amplified (CA) resists have multifarious commercial applications, many of which predominate in the semiconductor industry. There, CA resists are used inter alia for lithographic procedures occurring at 248 nm or less wherein the chemistry is not driven directly by photons absorbed in the exposure step, but rather by an acid formed during exposure of a photo-acid generator (PAG) which catalyzes chemical changes in the resist during a bake step immediately following exposure. Since the reaction is catalytic, the acid is regenerated after each chemical reaction; the same acid molecule can participate in further reactions.

The biggest advantage of a CA system is in its speed. These materials further express high contrasts and typically have very high resolution, with gamma values of 5–10 vs. 2–3 for novolak resists (Seeger, David "Chemically Amplified Resists for Advanced Lithography: Road to Success or Detour?" *Solid State Technology;* June 1997; pp.115–121). However, the catalytic nature of the CA process makes reproducibility an important concern. Should the catalytic chain be interrupted unexpectedly, many lithographic important reactions would not take place, thereby resulting in catastrophic resist failures. The most common interruptions occur when an airborne base penetrates into the photoresist and quenches the photo-generated acid, resulting in skins on the surface of the resist which prevent clean development from occurring.

U.S. Pat. Nos. 6,156,682; 6,146,793; and 5,985,524 all discuss bilayer resists wherein a base underlayer material is etched with oxygen. After the resist image is developed in tetramethylammonium hydroxide the polymeric underlayer is then oxygen etched and the image is transferred. Thus the etched out polymeric underlayer becomes an etching mask, which is sufficiently thick so as to be able to withstand most etching processes. However these materials are not suitable for chrome mask making due to their thickness.

Unfortunately, the prior art materials currently in use for chrome mask making remain extremely problematic. Prior art mask making materials are awkward in reactive ion etching. In order to transfer the image from a chrome resist, one must etch the chrome via the conversion of chrome to chrome chloride and combine it with ions for release from the surface, thereby etching the resist down to the glass. This etched region thus becomes a transparent region within the chrome layer. The chrome etch process utilizes chlorine and oxygen gases to form the chrome chloride whereby the chrome material is literally sputtered away to form the non-volatile species, chrome chloride. Thus a great deal of ion bombardment becomes necessary to assist the sputtering or displacement of the chrome oxide from chrome chlorides from the surface. In performing such high ion bombardment, the photoresistant film of carbon also sputters and bombards away, thereby losing more than half the thickness of the film material. This loss of material causes an alignment variation of the final etch chrome feature. Since these resists are very thin to begin with, measuring merely 2,000–3,000 angstroms each, and wherein the chrome layer is approximately 1,200 angstroms thick, the conventional photoresist will lose more than 1500 angstroms of its thickness during such a chrome etch process. Preferably, a material which is capable of resisting chlorine will be developed that can be incorporated into conventional resist compositions.

U.S. Pat. No. 6,187,505 discloses a negative bilayer variation of a silicon oxygen type of polymer backbone which has a phenol OH group attached to a silicon what is commonly referred to as a network lattice. However, to synthesize this polymer a siloxane monomer or a silicon trichloride derivative must be added to an acid or base thereby resulting in a very wide variety of products of that reaction. The use of varied products makes such a synthesis very difficult to reproduce on a large scale.

The kinetics of the catalytic reaction are also important. Careful control of temperature uniformity and bake time must be maintained. Similar to the problems encountered with chrome etching, any nonuniformities will change the critical dimension (CD) on the wafer. The CD variations are a direct effect of variant bake temperatures in so much as the actual bake temperature depends upon the temperature uniformity of the bake plate and the bake latitude of the resist. Even the very best resist systems require a hot plate uniformity on the order of 0.1° C. in order to meet the desired line width control for 0.1-$\mu$m lithography. Since this control is a resist limitation and is beyond current specifications for hot plate uniformities, more advanced lithographies will require improvements to the bake technologies.

U.S. Pat. No. 5,886,119 discloses a terpolymer for use in chemically reinforced photoresists wherein multilayering techniques are desirable. However, these materials further require the bake steps as previously discussed.

U.S. Pat. No. 5,976,759 discloses polymer compositions and resist materials further requiring the contested bake steps.

Unfortunately, the development of a heating system with such high precision uniformly across the plate would cost the industry upwards of close to a million dollars. Thus it becomes clear there is a definitive need in the art for chemically amplified resist materials which do not necessitate a bake step, thereby negating the inconsistency effects of hotplates. Such a material would preferably not require post exposure baking but rather would be reactive at room temperature. Furthermore, there is a need in the industry for a material which will improve the mask making process by providing both very good resistance to chlorine or oxygen type etching gases.

SUMMARY OF THE INVENTION

The present invention is directed to a class of terpolymers and the use of such terpolymers in chemically amplified resists. Particularly, the present invention provides a terpolymer comprising the general structure:

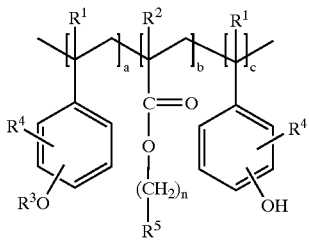

wherein:
a is from about 5 to about 70;
b is from about 3 to about 35;
c is from about 0 to about 92;
$R^1$ is H, $C_1$–$C_4$ alkyl, aryl, CN, or a halogen, preferably $R^1$ is H or —$CH_3$;
$R^2$ is H or $C_1$–$C_4$ alkyl, preferably $R^2$ is H or —$CH_3$;
$R^3$ is a protective room temperature reactive group selected from the group consisting of silylethers, acetals and ketals;
$R^4$ is an alkyl, hydrogen, halogen, aromatic or another cyclic alkyl group;
$R^5$ is a silicon-oxygen group maintained thereon;
n is 1, 2, 3, 4, 5, or 6, preferably n is 2 or 3; and
a+b+c=100%.

As will be made clearer herein, the terpolymers of the instant invention unexpectedly manifest significantly lower activation energies as compared to the terpolymers of the prior art. The inventive terpolymers require no baking when utilized in resist systems, as the terpolymers are reactive at room temperature. As shown above, monomer "a" contains a room temperature acid sensitive group, monomer "b" contains an acrylate or methacrylate with a silicon-oxygen side chain group and monomer "c" contains a substituted or unsubstituted phenolic group.

The terpolymers of the present invention solve a second problem of nonuniformity of etching or severe loss of resist material by incorporating chemical groups or partially incorporating the chemical group that will resist chlorine. The silicon atom or silicon-carbon chemistry of $R^5$ allow for the silicon atom in the presence of the chlorine-oxygen etch to actually form a glass material, silicon dioxide, which encapsulates or acts as a partial mask inside the surface or top of the surface of the photoresistors being etched thereby acting as if a glass mask has been placed atop the chrome of the etched resist material.

In accordance with another aspect of the present invention, a method of forming a positive resist is provided wherein a terpolymer in combination with photoacid generators and quenchers is used for $O_2$ and $Cl_2/O_2$ gas etch applications, said terpolymer having the following general polymeric structure:

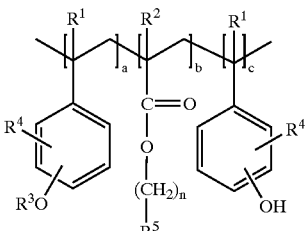

wherein:
a is from about 5 to about 70;
b is from about 3 to about 35;
c is from about 0 to about 92;
$R^1$ is H, $C_1$–$C_4$ alkyl, aryl, CN, or a halogen, preferably $R^1$ is H or —$CH_3$;
$R^2$ is H or $C_1$–$C_4$ alkyl, preferably $R^2$ is H or —$CH_3$;
$R^3$ is a protective room temperature reactive group selected from the group consisting of silylethers, acetals and ketals;
$R^4$ is an alkyl, hydrogen, halogen, aromatic or another cyclic alkyl group;
$R^5$ is a silicon-oxygen group maintained thereon;
n is 1, 2, 3, 4, 5, or 6, preferably n is 2 or 3; and
a+b+c=100%.

Such chemically amplified (CA) resists can be used inter alia for lithographic procedures using e-beam radiation or optical exposures at 248 nm or less as well as for etching crosslinked polymeric underlayers, chrome photomasks, polysilicons, polysilanes, copper, and aluminum without requiring a baking step.

A primary application for the positive resists of the present invention is for chrome mask fabrication. This material could also be used in the context of a bilayer application for semiconductor devices etching materials other than chrome.

In accordance with yet another aspect of the present invention, a method of forming a negative resist is provided wherein a copolymer in combination with acid generators, quenchers, and crosslinkers is used for $O_2$ and $Cl_2/O_2$ gas etch applications, said copolymer having the following general polymeric structure:

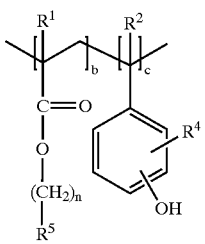

wherein:
b is from about 3 to about 35;
c is from about 65 to about 97;
$R^1$ is H, $C_1$–$C_4$ alkyl, aryl, CN, or a halogen, preferably $R^1$ is H or —$CH_3$;
$R^2$ is H or $C_1$–$C_4$ alkyl, preferably $R^2$ is H or —$CH_3$;
$R^4$ is an alkyl, hydrogen, halogen, aromatic or another cyclic alkyl group;
$R^5$ is a silicon-oxygen group maintained thereon;

n is 1, 2, 3, 4, 5, or 6, preferably n is 2 or 3; and b+c=100%.

Another object of the present invention is to provide a polymerization procedure requiring an O-protected hydroxystyrene monomers and siloxane containing acrylate or methacrylate monomers to copolymerize using classic free radical polymerization reactions. In doing so, one can control the number average molecular weight and the b/c ratios can be easily manipulated in high yield thereby creating a more reproducible and much easier method of synthesis for large scale preparation.

DETAILED DESCRIPTION OF THE INVENTION

As stated above, the present invention is directed to a class of terpolymers and the use of such terpolymers in chemically amplified resists. Particularly, the present invention provides a terpolymer comprising the general structure:

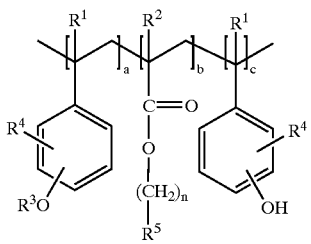

wherein:

a is from about 5 to about 70;

b is from about 3 to about 35;

c is from about 0 to about 92;

$R^1$ is H, $C_1$–$C_4$ alkyl, aryl, CN, or a halogen, preferably $R^1$ is H or —$CH_3$;

$R^2$ is H or $C_1$–$C_4$ alkyl, preferably $R^2$ is H or —$CH_3$;

$R^3$ is a protective room temperature reactive group selected from the group consisting of silylethers, acetals and ketals;

$R^4$ is an alkyl, hydrogen, halogen, aromatic or another cyclic alkyl group;

$R^5$ is a silicon-oxygen group maintained thereon;

n is 1, 2, 3, 4, 5, or 6, preferably n is 2 or 3; and a+b+c=100%.

Monomer unit "a" contains a protective group ($R^3$) designed to be room temperature chemically reactive. When the monomer unit is an acetal or a ketal group, more preferably a cyclic acetal (I) or ketal (II, III), the group may be represented by the following structures:

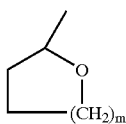

(I)

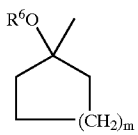

(II)

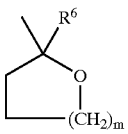

(III)

wherein $R^6$ is a $C_1$–$C_{12}$ alkyl, i.e., $CH_3$; and m is 1, 2, 3, or 4, preferably m is 2.

Thus, the terminal cycloalkane may be $C_5$–$C_8$, however preferably it is $C_6$. The monomer may be derived from a variety of compositions including, but not limited to: methoxycyclopropanyl, ethoxycyclopropanyl, butoxycyclohexanyl, methoxycyclobutanyl, ethoxycyclobutanyl, methoxycyclopentanyl, ethoxycyclopentanyl, methoxycyclohexanyl, ethoxycyclohexanyl, propoxycyclohexanyl, methoxycycloheptanyl, ethoxycycloheptanyl, methoxycyclooctanyl, methoxyadamantyl, ethoxyethylether, tetrahydropyrinyl, tetrahydrofuranyl, tetrahydropyrinyl, ethoxyvinylethers, phenolic acetals and ketals as well as cyclohexanyloxyethyl derivatives thereof and the like. Of these unsubstituted cyclic aliphatic ketals, it is highly preferred that methoxycyclohexanyl (MOCH) be employed as the acid labile protecting group of the inventive aqueous base soluble polymer or copolymer.

As shown above the $R^3O$— group is meta-, ortho-, or para-substituted on the benzene ring. Preferably the $R^3O$— group is para-substituted. Meta- and ortho-substitutions are more difficult to polymerize due to steric problems, however it should be noted that such are anticipated by the present invention. Furthermore, on the ketal group, $R^6$ is a $C_1$–$C_{12}$ alkyl, i.e., $CH_3$, $CH_3CH_2$, etc.

Monomer unit "a" is present in an amount ranging from about 5 to about 70% of the total terpolymer. Preferably, monomer unit "a" is present in the instant inventive terpolymer in an amount of from about 10 to about 35%.

When the room temperature acid sensitive groups is a silylether, $R^3$ typically is —$SiC_{1-6}$ alkyl. Some examples of silylethers include, but are not limited to: trimethysilylether, dimethylethylsilylether, dimethylpropylsilylether and derivatives thereof. Of these silylethers, it is preferred that trimethylsilylether be employed in the present invention. Silylethers generally require a lot of water to hydrolyze and a bit more acid to deprotect than their ketal counterparts, however they remain sensitive at room temperature.

The acrylate or methacrylate monomer "b" with a silicon-oxygen group side chain maintained thereon is a glass like material that will form a silicon dioxide mask during the second part of the process of transferring the resist image to the chrome surface. The siloxane or silicon-oxygen group imparts etch resistance, thereby allowing a phenol group, which would ordinarily not be protected or partially protected with a ketal group, to be present, thereby giving the polymer chain a finite solubility in a developer such as an aqueous base developer of tetramethylammonium hydroxide which dissolves away the polymer chain. It is further noteworthy that potassium hydroxide as well may be utilized as the developer solution. The exposed resist film is rendered positive working by employing a polar developer, preferably an aqueous based developer such as quaternary ammonium hydroxide solutions (e.g., a tetra-alkyl ammonium hydroxide solution, various amine solutions, preferably 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

The extender group $(CH_2)_n$ between the oxygen of the monomer backbone and the silicon contained in the $R^5$ group affords the polymer the ability to be either acid sensitive or acid insensitive. Thus, n is 1, 2, 3, 4, 5 or 6; preferably n is 2 or 3.

$R^5$ is a silicon-oxygen containing compound resistant to chlorine and oxygen gas etching procedures on chrome resists such as a silane. The terpolymers of the present invention solve a second problem of nonuniformity of etching or severe loss of resist material by incorporating chemical groups or partially incorporating the chemical group that will resist chlorine. The silicon atom or silicon-carbon chemistry of $R^5$ allows for the silicon atom in the presence of the chlorine-oxygen etch to actually form a glass material, silicon dioxide, which encapsulates or acts as a partial mask inside the surface or top of the surface of the photoresistor being etched thereby acting as if a glass mask has been placed atop the chrome of the etched resist material. $R^5$ may be tristrimethylsiloxysilane, tris (vinyldimethylsiloxy silane) bis(trimethylsiloxy) methylsilane, for example. Preferably, $R^5$ is tristrimethylsiloxysilane.

Monomer "b" is not chemically active per se to acid; instead monomer "b" is referred to as an acid inactive group wherein it maintains an etch resistant group containing the silicon oxide type of chemical structure. Thus in the etch bath or etch gas one needs a sufficient amount of "b" monomeric groups to reduce the etch resistance or remaining film by a factor of 2 or 3 less on resist. Therefore, instead of losing 200 nanometers as may be seen with prior art compositions, the present invention may only lose about 50 to 100 nanometers, thereby providing sufficient etch resistance and no severe change in language across the plate during the reactive ion etching.

Monomer unit "b" is present in an amount ranging from about 3 to about 35% of the total polymer. Preferably, monomer unit "b" is present in the instant inventive terpolymer in an amount of from about 5 to about 15%.

Monomer "c" contains a substituted or unsubstituted phenolic group such as parahydroxystyrene or vinylphenol. Metahydroxystyrene and orthohydroxystyrene may be used in the embodiment of the present invention, as symmetry is essentially irrelevant, and there could be other substituents on the benzene ring. Ortho- and meta- are more difficult to polymerize and the hydroxy group is more readily soluble in the developer. However, such substitutions are indeed within contemplation of the present invention. The phenolic group "c" imparts the acid solubility necessary and may be derived from a variety of compositions. When substituted, $R^4$ could be an alkyl, hydrogen, halogen, aromatic or another cyclic alkyl group. When $R^4$ is an alkyl group, it is $C_1$ through $C_6$, preferably $C_1$. When $R^4$ is an aromatic or another cyclic alkyl group it comprises $C_5$ through $C_{15}$, preferably $C_6$.

Monomer unit "c" is present in an amount ranging from about 0 to about 92% of the total polymer. Preferably, monomer unit "c" is present in the instant inventive terpolymer in an amount of from about 50 to about 85%.

These terpolymer materials further include other extensions due to the present invention's etch resistance to oxygen. In bilayer etching a thin layer of a silicon containing resist material is placed on top of a thick plated crosslink polymeric underlayer. For example, if 200 nanometers of a siloxane copolymer or terpolymer of the present invention is placed on top of about 500 to about 800 nanometers of some phenol like resin and then heated to high temperatures the materials could become insoluble in the tetramethylammonium hydroxide developer. Furthermore the electron beam can further be utilized as a mask itself by transferring its image from the 200 nanometer resistance image into the 800 nanometer thick crosslink polymer chain. The terpolymer "abc" of the present invention effectively comprises a, b, and c in a ratio so as to obtain the desired photochemical and solubility properties. The molar ratio of a/b/c is roughly 2/1/7, however it can comprise additional ratios and still be actively effective. Monomer unit "a" may comprise anywhere from about 5% to about 60% mole percent of the composition. Preferably monomer unit "a" comprises about 10% to about 35% mole percent of the composition. Monomer unit "b" may comprise anywhere from about 3% to about 35% mole percent of the composition. Preferably monomer unit "b" comprises about 5% to about 15% mole percent of the composition. Monomer unit "c" may comprise anywhere from about 5% to about 92% mole percent of the composition. Preferably monomer unit "c" comprises about 50% to about 85% mole percent of the composition.

The number average molecular weight of this compound as a whole maintains a lower limit of about 1,000 and an upper limit of about 100,000 number average molecular weight. A preferred range for the molecular weight is about 3,000 to about 10,000 due to the solubility requirements of the lithographic process. In order to dissolve the exposed positive resist (containing deprotected terpolymer) film away in a preferred time of approximately 60 seconds or less, a composition with too high a molecular weight will generally take longer than 60 seconds to dissolve. Furthermore compositions with a molecular weight of less than 3,000 tend to dissolve in 10 seconds or less and thus the process becomes uncontrollable. Preferably the molecular weight coincides with a development time within the range of about 45 to about 60 seconds.

Conversely to the formation of a positive resist, in forming a negative resist material, a reverse tone is utilized where instead of the exposed region developing away, the unexposed region develops away. The negative resist of the present invention is a copolymer in combination with an acid sensitive crosslinking agent, photoacid generators and quenchers. In effect the "a" monomeric group has been eliminated from the polymer chain and all that remains is the "b" and the "c" monomeric units. Structurally, the compound takes on a copolymer having the structure:

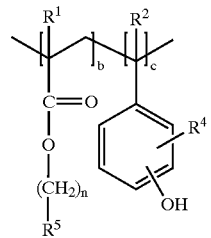

wherein:
b is from about 3 to about 35;
c is from about 65 to about 97;
$R^1$ is H, $C_1$–$C_4$ alkyl, aryl, CN, or a halogen, preferably $R^1$ is H or —$CH_3$;
$R^2$ is H or $C_1$–$C_4$ alkyl, preferably $R^2$ is H or —$CH_3$;
$R^4$ is an alkyl, hydrogen, halogen, aromatic or another cyclic alkyl group;
$R^5$ is a silicon-oxygen group maintained thereon;

n is 1, 2, 3, 4, 5, or 6, preferably n is 2 or 3; and b+c=100%.

Monomer units "b" and "c" are substantively as they have been disclosed above. However, in the negative resist, monomer unit "b" is present in an amount ranging from about 3 to about 35. Preferably, monomer unit "b" is present in the instant inventive copolymer in an amount of from about 5 to about 20. Monomer unit "c" is present in an amount ranging from about 65 to about 97. Preferably, monomer unit "c" is present in the instant inventive copolymer in an amount of from about 80 to about 95. In the instant case, the ratio of b/c is preferably 1/6; most preferably the ratio of b/c in the negative resist is 1/9. Furthermore, the negative resist molecular weight would be similar to that of the positive resist. Thus the number average molecular weight range of the negative resist is about 1,000 to about 100,000 with a preferred range of about 3,000 to about 10,000 molecular weight.

The photoacid generators used in the chemically amplified resist system of the present invention are compounds which generate strong acids upon exposure to energy. Examples of photoacid generators are discussed in great length in U.S. Pat. No. 5,258,257 and are incorporated by reference herein. The preferred acid generators employed in the present invention are onium salts.

The quenchers employed in the present invention are well known bases whose function employs them to scavange protons generated in the chemically amplified resist systems. This acid-base neutralization process can extend the shelf life of a resist and reduce air borne contaminants, thereby enhancing the lithographic performance of the resist. Typical bases which can be employed by the present invention include weak bases such as carboxlate salts, and strong bases such as amine phenoxides and hydroxides. Preferably the bases are phenoxides and quaternary ammonium hydroxides.

The solvents that are employed in the resist formulation of the present invention are well known solvents that are employed in the prior art to dissolve acid sensitive polymers. Illustrative examples of such solvents include, but are not limited to: ethers, glycol ethers, aromatic hydrocarbons, ketones, esters and the like may be employed in the present invention.

Suitable glycol ethers that can be employed in the present invention include: 2-methoxyethyl ether (diglyme), ethylene glycol monomethyl ether, propylene glycol monomethyl ether, propylene glycol monomethyl ether acetate (PGMEA) and the like. Examples of aromatic hydrocarbons that may be employed in the present invention include toluene, xylene and benzene; examples of ketones include methylisobutylketone, 2-heptanone, cycloheptanone, and cyclohexanone; an example of an ether is tetrahydrofuran; whereas ethyl lactate and ethoxy ethyl propionate are examples of esters that can be employed in the present invention. Of the solvents mentioned hereinabove it is preferred that a glycol ether or ester be employed, with PGMEA being the most preferred glycol ether and ethyl lactate is the most preferred ester.

In synthesizing these polymers, the following modified synthesis route of silane copolymer is utilized:

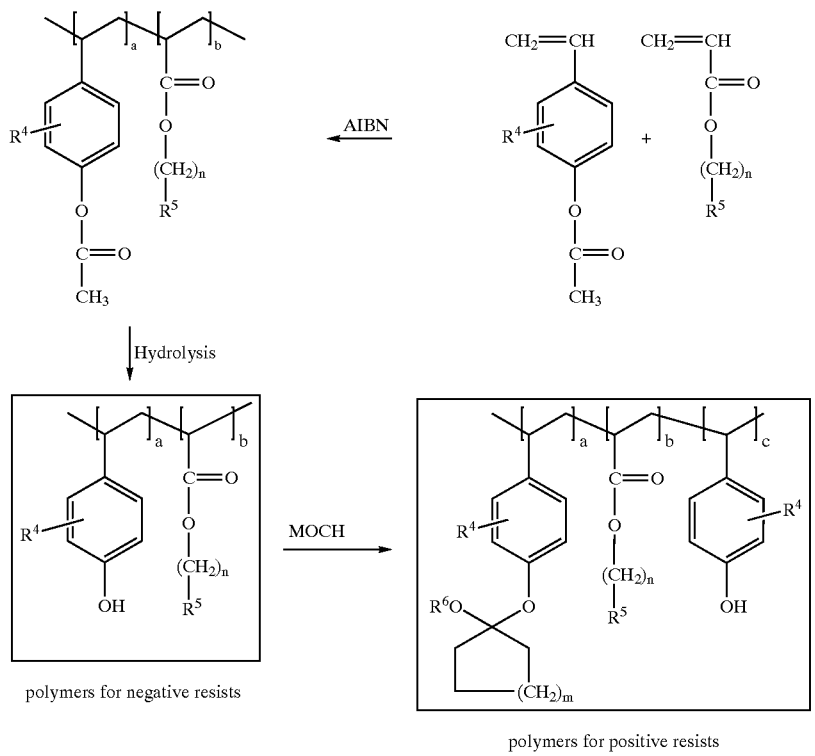

polymers for negative resists polymers for positive resists

To formulate the negative tone resists with the above polymers, crosslinking agents, such as those disclosed in U.S. Pat. No. 6,187,505, may be utilized. The crosslinking component is preferably a crosslinker that can be reacted with the SiO containing polymer in a manner which is catalyzed by generating acid and/or by heating. Generally, the crosslinking component used in the compositions of the present invention may be any suitable crosslinking agent known in the negative photoresist art which is otherwise compatible with the other selected components of the composition. The crosslinking agents preferably act to crosslink the polymer component in the presence of a generated acid. Preferred crosslinking agents are glycoluril compounds such as tetramethoxymethyl glycoluril, methylpropyltetramethoxymethyl glycoluril, and methylphenyltetramethoxymethyl glycoluril, available under the POWDER-LINK trademark from American Cyanamid Company. Other possible crosslinking agents include: 2,6-bis(hydroxymethyl)-p-cresol, compounds having the following structures:

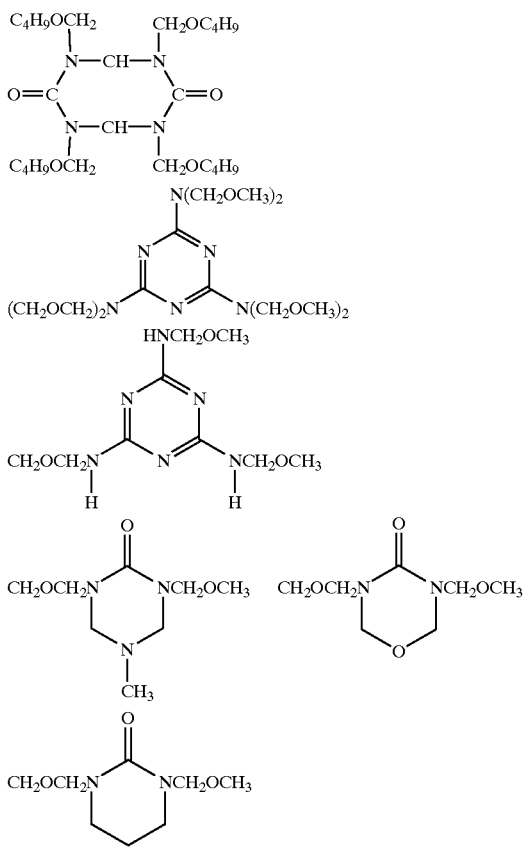

including their analogs and derivatives, such as those found in Japanese Laid-Open Patent Application (Kokai) No. 1-293339, as well as etherified amino resins, for example, methylated or butylated melamine resins (N-methoxymethyl- or N-butoxymethylmelamine respectively) or methylated/butylated glycolurils, for example, as can be found in Canadian Patent No. 1,204,547. Other crosslinking agents such as bis-epoxies or bis-phenols (e.g., bisphenol-A) may also be used. Combinations of crosslinking agents can also be used.

The blending is typically carried out at a desired temperature for a time period of from about 1 to about 48 hrs. More preferably, the blending is carried out for a time period of from about 5 to about 24 hrs. Suitable organic solvents which can be employed in the blending step include, but are not limited to: ethers, glycol ethers, aromatic hydrocarbons, ketones and esters. The solvents used in the blending step can be the same or different from the solvent used in the resist system. Highly preferred organic solvents employed in the blending step are propylene glycol monomethyl ether acetate (PGMEA), cyclohexanone, ethyl lactate and ethoxy ethyl proponate.

The resist compositions of the present invention (containing the acid generators as described in U.S. Pat. No. 5,258,577) are especially useful for lithographic processes used in the manufacture of integrated circuits on semiconductor substrates. The compositions are especially useful for lithographic processes using 248 nm or 193 nm UV radiation. Where use of other radiation (e.g. mid-UV, x-ray, or e-beam) is desired, the compositions of the present invention can be adjusted (if necessary) by the addition of an appropriate dye or sensitizer to the composition. The general use of the resist compositions of the present invention in lithography for semiconductors is described below.

Semiconductor lithographic applications generally involve transfer of a pattern to a layer of material on the semiconductor substrate. The material layer of the semiconductor substrate may be a metal conductor layer, a ceramic insulator layer, a semiconductor layer or other material depending on the stage of the manufacture process and the desired material set for the end product. In many instances, an antireflective coating (ARC) is applied over the material layer before application of the resist layer. The ARC layer may be any conventional ARC which is compatible with acid catalyzed resists.

Typically, the solvent-containing resist composition is applied to the desired semiconductor substrate using spin coating or another technique. The thickness of the applied layer is preferably as thin as possible with the provisos that the thickness is preferably substantially uniform and that the resist layer be sufficient to withstand subsequent processing (typically reactive ion etching) to transfer the lithographic pattern to the underlying substrate material layer.

After solvent removal, the resist layer is then patternwise-exposed to the desired radiation (e.g., 193 nm ultraviolet radiation). Where scanning particle beams such as electron beam are used, patternwise exposure may be achieved by scanning the beam across the substrate and selectively applying the beam in the desired pattern. More typically, where wavelike radiation forms such as 193 nm ultraviolet radiation are used, the patternwise exposure is conducted through a mask which is placed over the resist layer.

The resist structure with the desired pattern is obtained (developed) preferably by contacting the resist layer with an alkaline solution which selectively dissolves the areas of the resist which were exposed to radiation in the case of positive resist (or unexposed areas in the case of negative resist). Preferred alkaline solutions (developers) are aqueous solutions of tetramethyl ammonium hydroxide. Preferably, the resist compositions of the invention can be developed with conventional 0.26N aqueous alkaline solutions. The resist compositions of the invention can also be developed using 0.14N or 0.21N or other aqueous alkaline solutions. The resulting resist structure on the substrate is then typically dried to remove any remaining developer solvent. The resist compositions of the invention are generally characterized in that the product resist structures have high etch resistance. In some instances, it may be possible to further enhance the etch resistance of the resist structure by using a post-silylation technique using methods known in the art.

The pattern from the resist structure may then be transferred to the material (e.g., ceramic, metal or semiconductor) of the underlying substrate. Typically, the transfer is achieved by reactive ion etching or some other etching technique. In the context of reactive ion etching, the etch resistance of the resist layer is especially important. Thus, the compositions of the invention and resulting resist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

The processes for making these (ceramic, metal or semiconductor) features generally involve providing a material layer or section of the substrate to be patterned, applying a layer of resist over the material layer or section, patternwise exposing the resist to radiation, developing the pattern by contacting the exposed resist with a solvent, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. Examples of such processes are disclosed in U.S. Pat. Nos. 4,855,017; 5,362,663; 5,429,710; 5,562,801; 5,618,751; 5,744,376; 5,801,094; and 5,821,169, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

The specific photoacid generator selected will depend on the irradiation being used for patterning the resist. Exposure sources that could be used include preferably the electron beam but there is other forms of radiation are the acid that can be generated. Photoacid generators are currently available for a variety of different wavelengths of light from the visible range to the X-ray range; thus, imaging of the resist can be performed using deep-UV, extreme-UV, e-beam, laser or any other irradiation source deemed useful. Extreme ultra violet uses short x-rays of 13 nanometer x-rays those are another technique of using ultraviolet light we call deep UV at 248 nanometers or one could use a even shorter wave length 157 nanometer which is called Far UV radiation. An ion beam radiation which is not really invoked today but still could be used are higher wave length x-ray could also be used, called Hard and Soft X-rays like normal UV and FUV. The types of typical sources for mask making are preferably the electron beam and 248 nm light. Both are used to make masks today to expose resists on top of chrome.

Specifically, in terms of application and use, all radiation sources may be utilized with specific consideration for those listed above. The compositions of the present invention may be utilized in a variety of functions including in bilayer approach for e-beam projection printing for device making; bilayer approach for EUV lithograph and bilayer or single layer approach for mask making and chrome etching.

EXAMPLES

Unless otherwise noted, the following general procedures were employed to synthesize the copolymers of the present invention. The copolymers were prepared via a reaction of a composition comprising an acetoxystyrene and silicon containing acrylate or methacrylate.

The copolymers of the present invention are made by a free radical polymerization using 2,2-Azobisisobutyronitrile, or AIBN, an initiator utilized for classic free radical polymerization. Although AIBN is commonly used to make acrylates, derivatives like Plexiglas and many vinyl compounds are made via this classical free radical polymerization. The polymer chain, consisting primarily of b and c units, is then combined with a ketal group where the partially attached ketal group is secured to the chain via a trace of acid to catalyze an addition reaction thereby formulating the composition "abc".

Generally the present invention utilizes 0.1–10 weight percent of photo acid generatiors with 0.01–3 weight percent of quenchers and the rest is polymer.

Example 1

Synthesis of hydroxystyrene-(3-acryloxypropyl) trimethylsiloxy silane copolymer (polymer A)

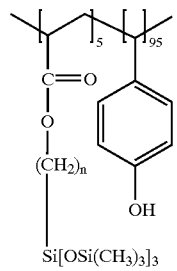

5 g (3-acryloxypropyl)trimethylsiloxy silane, 38 g acetoxystyrene and 2.41 g AIBN were dissolved in 128 g THF and charged into a 3-neck flask. The system was then purged with $N_2$ for 30 mins before the temperature was raised to 65° C. The reaction was carried out overnight under $N_2$. On the second day, 100 g methanol and 30 mL 30% ammonia hydroxide were added to the system and the temperature was kept at 60° C. The reaction was carried out overnight under $N_2$. On the third day, the solution was precipitated in 2000 mL water and 20 mL acetic acid. The polymer was collected and dried in vacuum oven overnight at 40° C. The molecular weight was determined by gel permeation chromatography (GPC) to be 7.5K.

Example 2

Synthesis of hydroxystyrene-(3-acryloxypropyl) trimethylsiloxy silane copolymer

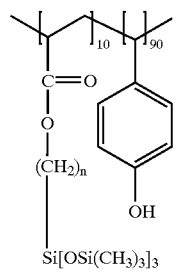

10 g (3-acryloxypropyl)trimethylsiloxy silane, 36 g acetoxystyrene and 2.41 g AIBN were dissolved in 137 g THF and charged into a 3-neck flask. The system was then purged with $N_2$ for 30 mins before the temperature was raised to 65° C. The reaction was carried out overnight under $N_2$. On the second day, 100 g methanol and 30 mL 30% ammonia hydroxide were added to the system and the temperature was kept at 60° C. The reaction was carried out overnight under $N_2$. On the third day, the solution was precipitated in 2000 mL water and 20 mL acetic acid. The polymer was collected and dried in vacuum oven overnight at 40° C. The molecular weight was determined by GPC to be 6.8K.

Example 3

Synthesis of hydroxystyrene-(3-acryloxypropyl) trimethylsiloxy silane copolymer

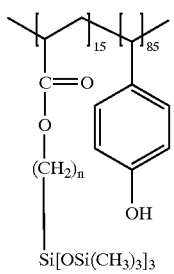

12.5 g (3-acryloxypropyl)trimethylsiloxy silane, 28 g acetoxystyrene and 2.01 g AIBN were dissolved in 122 g THF and charged into a 3-neck flask. The system was then purged with $N_2$ for 30 mins before the temperature was raised to 65° C. The reaction was carried out overnight under $N_2$. On the second day, 100 g methanol and 30 mL 30% ammonia hydroxide were added to the system and the temperature was kept at 60° C. The reaction was carried out overnight under $N_2$. On the third day, the solution was precipitated in 2000 mL water and 20 mL acetic acid. The polymer was collected and dried in vacuum oven overnight at 40° C. The molecular weight was determined by GPC to be 6.5K.

Example 4

Synthesis of hydroxystyrene-(3-methacryloxypropyl)trimethylsiloxy silane copolymer (polymer B)

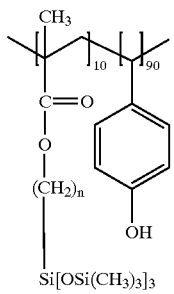

10 g (3-methacryloxypropyl)trimethylsiloxy)silane, 35 g acetoxystyrene and 2.33 g AIBN were dissolved in 133 g THF and charged into a 3-neck flask. The system was then purged with $N_2$ for 30 mins before the temperature was raised to 65° C. The reaction was carried out overnight under $N_2$. On the second day, 100 g methanol and 30 mL 30% ammonia hydroxide were added to the system and the temperature was kept at 60° C. The reaction was carried out overnight under $N_2$. On the third day, the solution was precipitated in 2000 mL water and 20 mL acetic acid. The polymer was collected and dried in vacuum oven overnight at 40° C. The molecular weight was determined by GPC to be 5.8K.

Example 5

Synthesis of hydroxystyrene-(3-acryloxypropyl) trimethylsiloxy silane copolymer

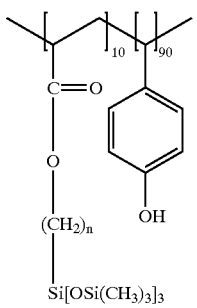

Synthesis of a Copolymer by Direct Copolymerization 15 g (3-acryloxypropyl)trimethylsiloxy silane, 40 g hydroxystyrene and 2.4 g AIBN were dissolved in 80 g THF and charged into a 3-neck flask. The system was then purged with $N_2$ for 30 mins before the temperature was raised to 65° C. The reaction was carried out overnight under $N_2$. On the second day, the solution was precipitated in 2000 mL water. The polymer was collected and dried in vacuum oven overnight at 40° C. The molecular weight was determined by GPC to be 9.1K and the molecular weight showed bimodal distribution.

Example 6

Synthesis of partially methoxycyclohexane protected hydrostyrene-(3-acryloxypropyl trimethylsiloxy silane copolymer 67 g of propylene glycol methyl ether acetate (PGMEA) was added to 10 g of polymer A, synthesized in Example 1, and this mixture was stirred until a clear solution was obtained. The clear solution was then added in with approximately 10 mg of oxalic acid. After the acid was dissolved, 2.67 g 1-methoxy-cyclohexene was added to the solution, and the reaction was carried out at room temperature with stirring overnight. The reaction was then quenched with 2 g of basic active aluminum oxide. The protection level on the phenol group was determined by $C^{13}$ NMR to be 20%.

Example 7

Synthesis of partially methoxycyclohexane protected hydrostyrene-(3-methacryloxypropyl trimethylsiloxy silane copolymer The same procedure as Example 6 was employed in this example. Specifically, about 30 g PGMEA solution containing 35% polymer B, synthesized in Example 4, was added in with about 10 mg of oxalic acid and 2.1 g of 1-methoxy-cyclohexene. The reaction was quenched by 2 g of basic active aluminum oxide and showed 17 mole % protection on the phenol groups of the polymer.

Example 8

Formulation and lithographyic evaluation of partially MOCH protected hydroxystyrene-(3-acryloxypropyl)trimethylsiloxy)silane copolymer Resist of 1-methoxy-cyclohexene protected polymer A, of Example 1, (20 mole % protection, Example 6) was evaluated using a 75 keV e-beam exposure tool. The resist was formulated with 2.7 wt. % triphenylsulfonium triflate (TPSTF) and 0.14 wt. % tetrabutylyammonium hydorixide (TBAH) of the partially protected polymer and 200–400 ppm of FC-430 surfactant in PGMEA. The resist coated wafers were processed with 110 C/60 s PAB and 110 C/60 s PEB and developed in 0.263N tetramethylammonium hydorixide (TMAH) for 60 seconds. High resolution images of 75 nm nested lines on a 1:1 pitch were obtained at 15 $\mu C/cm^2$ with resist thickness around 300 nm. Ultra high resolution images of 55 nm nested lines on a 1:1 pitch were obtained at 20 $\mu C/cm^2$ with resist thickness around 150 nm.

Example 9

Formulation and lithographic evaluation of partially MOCH protected polymer B

Resist of 1-methoxy-cyclohexene protected polymer B, of Example 4, (17 mole % protection, Example 7) was evaluated using a 75 keV e-beam tool. The resist was formulated with 2.7 wt. % TPSTF and 0.14 wt. % TBAH of the partially protected polymer and 200–400 ppm of FC-430 surfactant in PGMEA. The resist coated wafers were processed with 110 C/60 s PAB and 110 C/60 s PEB and developed in 0.263N TMAH for 60 seconds. High resolution images of 75 nm nested lines on a 1:1 pitch were obtained at 16 $\mu C/cm^2$ with resist thickness around 300 nm.

Example 10

Formulation and lithographic evaluation of negative tone resist formulated with polymer B Negative tone resists formulated with polymer B, of Example 4, were evaluated using a 25 keV e-beam tool. The resist was formulated with 3 wt. % TPSTF and 0.14 wt. % TBAH and 8 wt. % powder link of the polymer B and 200–400 ppm of FC-430 surfactant in PGMEA. The resist coated wafers were processed with 110 C/60 s PAB and 110 C/120 s PEB and developed in 0.263N TMAH for 60 seconds. With this process condition, images of 150 nm spaces were resolved on a 2:1 (L/S) pitch at 16 $\mu C/cm^2$ with resist thickness around 300 nm.

Example 11

Comparison of the resist formulated in Example 8 to a resist formulated with methoxycyclohexene protected polyhydroxystyrene A resist was formulated with 25 mole % methoxycyclohexene protected polyhydroxystyrene as resin, 0.7 wt. % TPSTF as photoacid generator and 0.14 wt. % TBAH as base quencher based on the weight of this polymer resin, and 200–400 ppm of FC-430 as surfactant in PGMEA solvent. Resist formulated in Example 8 was then exposed with ElectronCure™-200M E-beam flood exposure tool at various doses in comparison to resist formulated here. Both resists were processed exactly the same condition as described in Example 8. The normalied resist film thickness was then plotted against log of clearing dose. Both showed high contrast (>10) with slightly different clearing dose. The resist formulated from example 8 was post exposure baked at 90°, 100°, and 110° C., contrast curves were plotted the same way as described above after development. With slight variation, the contrast curves are almost superimposed to each other indicating the insensitivity of this resist to the baking temperature.

Example 12

Comparative example to a resist based on Poly(4-hydroxystyrene-co-2-Methacryloxyethyltris (trimethylsilyl)silane type polymer A 248 nm bilayer resist in which the polymer resin is a terpolymer with poly(4-hydroxystyrene-co-t-bytylacrylate-co-2-Methacryloxyethyltris(trimethylsilyl)silane as major composition was evaluated in comparison to the resist compositions based on Example 8&9. This 248 nm bilayer resist was spun onto a substrate and heated to 120° C. for 60 s. The composition is then imagewise exposed to electron beam using the FELS 25 KV e-beam exposure system. The composition is then subjected to a post exposure bake at 120° C. for 60 s and developed in 0.26N TMAH aqueous developer. At 12 $\mu C$, 250 nm L/S pattern appeared not being resolved. Upon cross-section of the pattern and examination under SEM, it shows that the images are resolved but with severe "T-top" formation that formed a continuous film on the top.

Example 13

Etch rate cmparison using $Cl_2/O_2$ (4/1) gas

Te etch was carried out with Lam 9400SE with TCP 600W, 20W bias, 6 mTorr pressure (48 $Cl_2$ and 12 $O_2$) at 30° C. for 60 seconds. The results of this etch are shown in Table 1.

TABLE 1

| $Cl_2/O_2$ Gas Etch Results | | |
|---|---|---|
| Material | Wt % Si | Etch Rate (nm/min) |
| M20G (commercial JSR resist) | 0 | 97 |
| Polymer from Example 1 | 4.2 | 79 |
| Polymer from Example 2 | 7.5 | 70 |
| Polymer from Example 4 | 7.5 | 52 |
| Regular KRS formulated in Example 11 | 0 | 96 |

As shown in Table 1, the incorporation of 7.5 wt. % of SI to the polymer can reduce the etch rate by up to 46% in comparison to the commercial CA resist during $Cl_2/O_2$ etching.

Example 14

Etch rate comparison using $O_2$ gas

Te etch was carried out with Lam 9400SE with TCP 300W, 20W bias, 6 mTorr pressure ($O_2$) at 30° C. for 30 seconds. The results of this etch are shown in Table 2.

TABLE 2

| $O_2$ Gas Etch Results | | |
|---|---|---|
| Material | Wt % Si | Etch Rate (nm/min) |
| M20G (commercial JSR resist) | 0 | 380 |
| Polymer from Example 1 | 4.2 | 144 |
| Polymer from Example 2 | 7.5 | 122 |
| Regular KRS formulated in Example 11 | 0 | 362 |

As shown in Table 2, within a short etch time of 30 seconds the etch rate of 7.5 wt. % Si containing polymer is already less than one third of the commercial CA resist during $O_2$ gas etching.

Having thus described our invention, what we claim as new, and desire to secure by Letters Patent is:

1. A terpolymer for use in chemically amplified resists comprising the general structure:

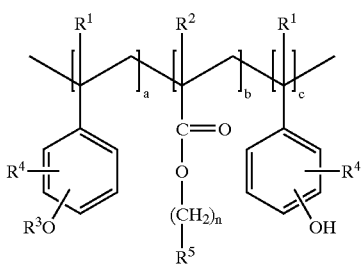

wherein:
  a is from about 5 to about 70;
  b is from about 3 to about 35;
  c is from about 0 to about 92;
  $R^1$ is H, $C_1$–$C_4$ alkyl, aryl, CN, or a halogen;
  $R^2$ is H or $C_1$–$C_4$ alkyl;
  $R^3$ is a protective room temperature reactive group selected from the group consisting of silylethers, cyclic acetals and cyclic ketals;
  $R^4$ is an alkyl, hydrogen, halogen, aromatic or another cyclic alkyl group;
  $R^5$ is a silicon-oxygen group maintained thereon;
  n is 1, 2, 3, 4, 5, or 6; and
  a+b+c=100%.

2. The terpolymer of claim 1 wherein $R^3$ is silylether.

3. The terpolymer of claim 2 wherein the silylether is a compound containing the general structure $SiC_{1-12}$ alkyl.

4. The terpolymer of claim 1 wherein $R^3$ is cyclic acetal or cyclic ketal.

5. The terpolymer of claim 4 wherein $R^3$ is of the general structure:

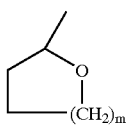

(I)

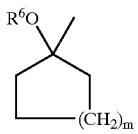

(II)

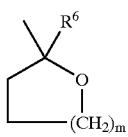

(III)

wherein
  m is 1, 2, 3, or 4; and
  $R^6$ is a $C_1$–$C_{12}$ alkyl.

6. The terpolymer of claim 1 wherein the monomer unit "b" contains an acrylate or methacrylate monomer with a silicon-oxygen side chain group maintained thereon.

7. The terpolymer of claim 1 wherein $R^5$ is tristrimethylsiloxy silane.

8. The terpolymer of claim 1 wherein monomer unit "a" comprises about 10% to about 35% mole percent of said terpolymer.

9. The terpolymer of claim 1 wherein the monomer unit "b" comprises about 5% to about 15% mole percent of said terpolymer.

10. The terpolymer of claim 1 wherein the monomer unit "c" comprises about 50% to about 85% mole percent of said terpolymer.

11. A positive chemically amplified photoresist used for $O_2$ and $Cl_2/O_2$ gas etch applications comprising a polymer with the following general structure:

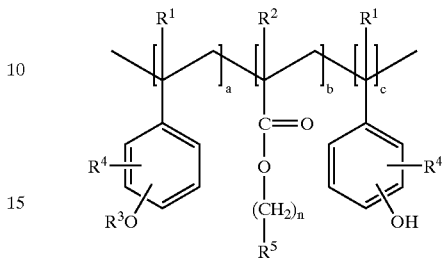

wherein:
  a is from about 5 to about 70;
  b is from about 3 to about 35;
  c is from about 0 to about 92;
  $R^1$ is H, $C_1$–$C_4$ alkyl, aryl, CN, or a halogen;
  $R^2$ is H or $C_1$–$C_4$ alkyl;
  $R^3$ is a protective room temperature reactive group selected from the group consisting of silylethers, cyclic acetals and cyclic ketals;
  $R^4$ is an alkyl, hydrogen, halogen, aromatic or another cyclic alkyl group;
  $R^5$ is a silicon-oxygen group maintained thereon;
  n is 1, 2, 3, 4, 5, or 6; and
  a+b+c=100%.

12. The positive resist of claim 11 wherein $R^3$ is silylether.

13. The positive resist of claim 12 wherein the silylether is a compound containing the general structure $SiC_{1-12}$ alkyl.

14. The positive resist of claim 11 wherein $R^3$ is cyclic acetal or cyclic ketal.

15. The positive resist of claim 14 wherein $R^3$ is of the general structure:

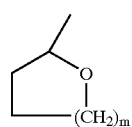

(I)

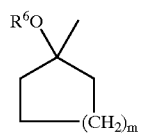

(II)

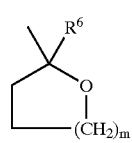

(III)

wherein
  m is 1, 2, 3, or 4; and
  $R^6$ is a $C_1$–$C_{12}$ alkyl.

16. The positive resist of claim 15 wherein m is 2.

17. The positive resist of claim 11 wherein the monomer unit "b" contains an acrylate or methacrylate monomer with a silicon-oxygen side chain group maintained thereon.

18. The positive resist of claim 11 wherein $R^5$ is tristrimethylsiloxy silane.

19. The positive resist of claim 11 wherein monomer unit "a" comprises about 10% to about 35% mole percent of said polymer.

20. The positive resist of claim 11 wherein the monomer unit "b" comprises about 5% to about 15% mole percent of said polymer.

21. The positive resist of claim 11 wherein the monomer unit "c" comprises about 50% to about 85% mole percent of said polymer.

22. A method of forming a patterned material structure on a substrate, said material being selected from the group consisting of semiconductors, ceramics and metals, said method comprising:

(A) providing a substrate with a layer of said material, (B) applying a chemically amplified resist composition to said substrate to form a resist layer on said substrate, said resist composition comprising:

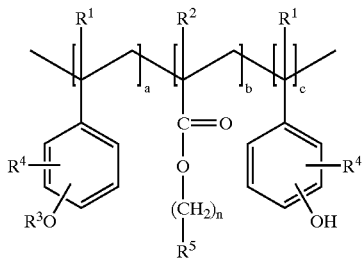

wherein:
   a is from about 5 to about 70;
   b is from about 3 to about 35;
   c is from about 0 to about 92;
   $R^1$ is H, $C_1$–$C_4$ alkyl, aryl, CN, or a halogen;
   $R^2$ is H or $C_1$–$C_4$ alkyl;
   $R^3$ is a protective room temperature reactive group selected from the group consisting of silylethers, cyclic acetals and cyclic ketals;
   $R^4$ is an alkyl, hydrogen, halogen, aromatic or another cyclic alkyl group;
   $R^5$ is a silicon-oxygen group maintained thereon;
   n is 1, 2, 3, 4, 5, or 6; and
   a+b+c=100%.

(C) patternwise exposing said substrate to radiation whereby acid is generated by said acid generator in exposed regions of said resist layer by said radiation, (D) contacting said substrate with an aqueous alkaline developer solution, whereby portions of said resist layer are selectively dissolved by said developer solution to reveal a patterned resist structure, and (E) transferring resist structure pattern to said material layer, by etching into said material layer through spaces in said resist structure pattern.

23. The method of claim 22 wherein a is from about 10 to about 35% mole percent of said composition; b is from about 5 to about 15% mole percent of said composition; and c is from about 50 to about 85% mole percent of said composition.

* * * * *